(12) United States Patent
Tanaka

(10) Patent No.: US 6,998,738 B2
(45) Date of Patent: Feb. 14, 2006

(54) PLAIN SURFACE STAGE APPARATUS

(75) Inventor: Yoneta Tanaka, Yokohama (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 181 days.

(21) Appl. No.: 10/686,636

(22) Filed: Oct. 17, 2003

(65) Prior Publication Data

US 2004/0080735 A1 Apr. 29, 2004

(30) Foreign Application Priority Data

Oct. 18, 2002 (JP) ............... 2002-304299

(51) Int. Cl.
H02K 41/00 (2006.01)
(52) U.S. Cl. ............... 310/12; 118/729; 33/568
(58) Field of Classification Search ............... 310/12; 355/53, 72; 118/728, 729; 33/568, 573
See application file for complete search history.

(56) References Cited

U.S. PATENT DOCUMENTS

| | | | |
|---|---|---|---|
| 4,958,115 A | 9/1990 | Miller | 318/662 |
| 5,157,296 A * | 10/1992 | Trumper | 310/90.5 |
| 5,543,890 A | 8/1996 | Tanaka et al. | 355/53 |
| 5,828,142 A | 10/1998 | Simpson | 310/12 |
| 6,170,622 B1 * | 1/2001 | Wakui et al. | 188/378 |

FOREIGN PATENT DOCUMENTS

| | | |
|---|---|---|
| JP | 09-023689 A1 | 1/1997 |
| JP | 2000-174101 A1 | 6/2000 |

* cited by examiner

Primary Examiner—Darren Schuberg
Assistant Examiner—Judson H. Jones
(74) Attorney, Agent, or Firm—Rader, Fishman & Grauer PLLC

(57) ABSTRACT

A plain surface stage apparatus includes a platen having a plain surface, stationary type supports comprising at least three supporting members, and displacement type supports, each of which supports the platen and forms a displacement type supporting point at a position other than those of supporting points formed by the stationary type supports, wherein the displacement type supports expand and contract in a direction perpendicular to the plain surface of the platen so as to be displaced, and holds a selected displaced state of the displacement type supports.

4 Claims, 5 Drawing Sheets

PLAIN SURFACE STAGE APPARATUS

TECHNICAL FIELD OF THE INVENTION

The present invention relates to a plain surface stage apparatus.

DESCRIPTION OF RELATED ART

Conventionally, a plain surface stage apparatus in which projecting poles formed in a grid structure, are provided on a plain surface of a platy platen is known. See Japanese Laid Open Patent Number 09-23689.

In such a plain surface stage apparatus, magnetic force is impressed to a movable body that floats in the air by air above the plain surface of the platen, thereby changing the magnetic filed between the movable body and the projecting poles of the platen so as to move the movable body above the platen surface.

The plain surface stage apparatus having such a structure are sometimes described as a surface motor stage apparatus or a Sawyer's motor stage apparatus.

Such a plain surface stage apparatus is different from a stage apparatus in which ball screws are used. In the plain surface stage apparatus, it is possible to freely move the movable body on a stage comprising a plain surface platen, and to make θ-rotation, without overlapping a plurality of stages, that is, an X-stage, a Y-stage and a θ-stage. In recent years, it has been studied to use such an apparatus as a work stage of a step and repeat exposure apparatus in which an exposure operation to each divided exposure area of a work piece which is provided on the movable body is in order carried out one after another by, for example, moving the movable body.

Since in such a step and repeat exposure apparatus using the plain surface stage apparatus as a work stage, the structure of the work stage is simple, it is expected that reduction in size and weight of the work stage can be accomplished.

However, when the plain surface stage apparatus is used for a step and repeat exposure apparatus in which a large size work piece such as a print circuit board, for example, larger than 1 meter on a side is processed by exposure, the size and volume of the movable body becomes larger because of the size of the work piece placed on the movable body so that the total volume of the movable body and the work piece becomes extremely large. (Hereinafter referred to "the movable body on which the work piece is placed" as a work piece movable body.)

On the other hand, since the platen of the plain surface stage apparatus is supported at three points by 3 supporting members, especially when the thickness of the platen is small, and for example, when the work piece movable body deviates from right above the supporting points that the supporting members support, the platen largely bends so that it is difficult to obtain high stability of flatness on the platen.

Accordingly, in such a step and repeat exposure apparatus using such a plain surface stage apparatus as a work stage, as shown in FIG. 8, it is difficult to carry out an exposure process to the work piece with high exposure accuracy thereby difficult to obtain reliability of the exposure processes, since when a platen 41 supported at three points by the three supporting members 43 (in FIG. 8, two of three supporting members are shown) bends, the position to the optical axis L of the work piece (not shown) placed on the movable body 44 lowers and the focal point 45A of a projection lens 45 is not located on the work piece.

In FIG. 8, the plain surface stage apparatus is placed on a base plate 47. Broken lines show a state of the platen 41 and the movable body 41 on the platen 41 where there is no bending.

Even though more than three supporting members are used, occurrence of the bending of the platen cannot be controlled since any three of the more than three supporting members form three supporting points to define the height and the horizontalness with respect to the surface on which the plain surface stage apparatus is provided, it is difficult to certainly form supporting points by all the more than three supporting members.

Accordingly, for a large work piece to be exposed by such a step and repeat exposure apparatus, as shown in FIG. 9, a plain surface stage in which a platen 41 is integrally provided on a base 49 having high flatness (flatness accuracy) such as a rock top plate, a trussing body, is used. In such a plain surface stage apparatus having such a structure, the base 49 grow in size so that the apparatus itself grows in size and becomes heavier. Further, the cost of apparatus increases since high process accuracy to maintain flatness of the base 49 is necessary.

In FIG. 9, projecting poles 42A have a grid structure and are provided on a plain surface 42 of the platen 41. A layer 42B is made of non-magnetic resin formed in depressed portions surrounded by the neighboring projecting poles 42A.

SUMMARY OF THE INVENTION

In view of the above problems, in the present invention it is an object to provide a small plain surface stage apparatus having platen with high stability of flatness in a simple manner.

According to the present invention, a plain surface stage apparatus includes a platen having a plain surface, stationary type supports comprising at least three supporting members, and displacement type supports, each of which supports the platen and forms a displacement type supporting point at a position other than those of supporting points formed by the stationary type supports, wherein the displacement type supports expand and contract in a direction perpendicular to the plain surface of the platen so as to be displaced, and holds a selected displaced state of the displacement type supports.

The displacement type supports may hold the displacement state in which the platen is supported by only the stationary type supports.

The plain surface stage apparatus may include a movable body which is movable on the plain surface of the platen.

Further, according to the present invention, a method for making a plain surface stage apparatus, comprising steps of preparing platen material having a plain surface as a particular plain surface, forming at least three supporting points on a rear side surface of the platen material by stationary type supports, adjusting height and horizontalness of the platen material with respect to a base plate, carrying out a plain surface process to the surface of the platen material in a state where the platen material is supported by only the stationary type supports and naturally bended by its own support, placing, in predetermined positions, a plurality of displacement type supports whose supporting bases are in contact with the rear side surface of the platen in the state where natural bending occurs, and forming displacement type supporting points by the displacement type supports.

According to the present invention, since, on the platen in a state where the height and the horizontalness with respect to the surface on which the plain surface stage apparatus is provided, are defined by the stationary type supports, the supporting points whose number corresponds to the number of the displacement type supporting means, are formed by the displacement type supporting means at positions other than the supporting points formed by the stationary type supports, it is possible to certainly support the platen by more than three points thereby preventing the apparatus itself from growing in size and controlling changes of flatness of the platen plain surface due to the bending of the platen by load onto the platen.

Further, since the displacement type supports expands and contracts in a direction perpendicular to the plane surface of the platen and has structure to hold a selected displacement state, and since it is possible to hold the displacement stage according to a state of the platen, it is possible to certainly and easily form new supporting points to the platen in the state where supporting points are formed by the stationary type supporting means.

Therefore, according to the present invention, in the plain surface stage apparatus, it is possible to obtain the excellent stability of flatness of the platen in a simple manner, and it is possible to miniaturize the apparatus itself.

The present invention will become more apparent from the following detailed description of the embodiments and examples of the present invention.

DETAILED DESCRIPTION OF THE INVENTION

Embodiments of the present invention will be described below with reference to the accompanying drawings.

Figure 1:
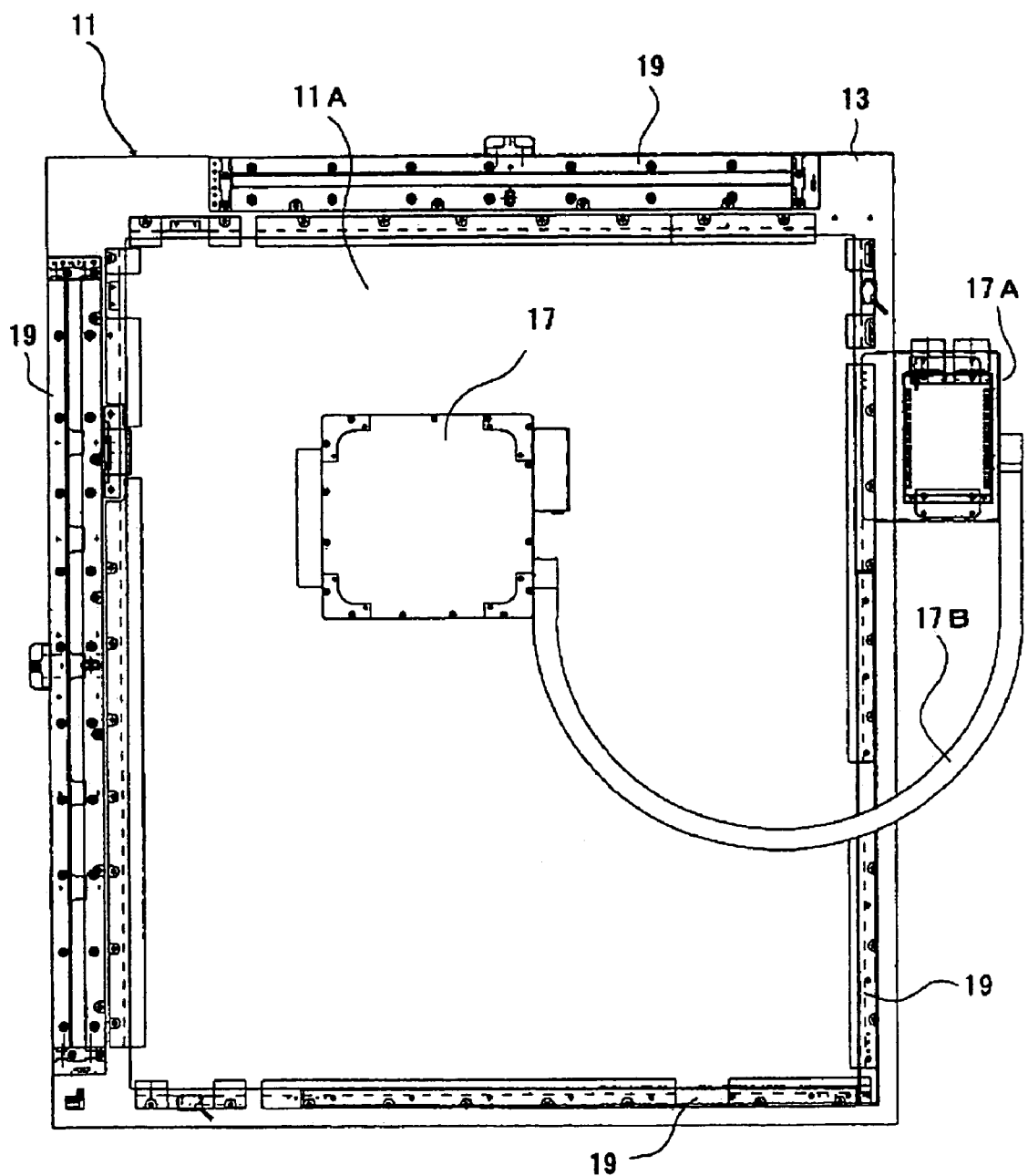
FIG. 1 is a top plain view of a plain surface stage apparatus according to the present invention.

FIG. 1 is a top plain view of a plain surface stage apparatus according to the present invention.

Figure 2:
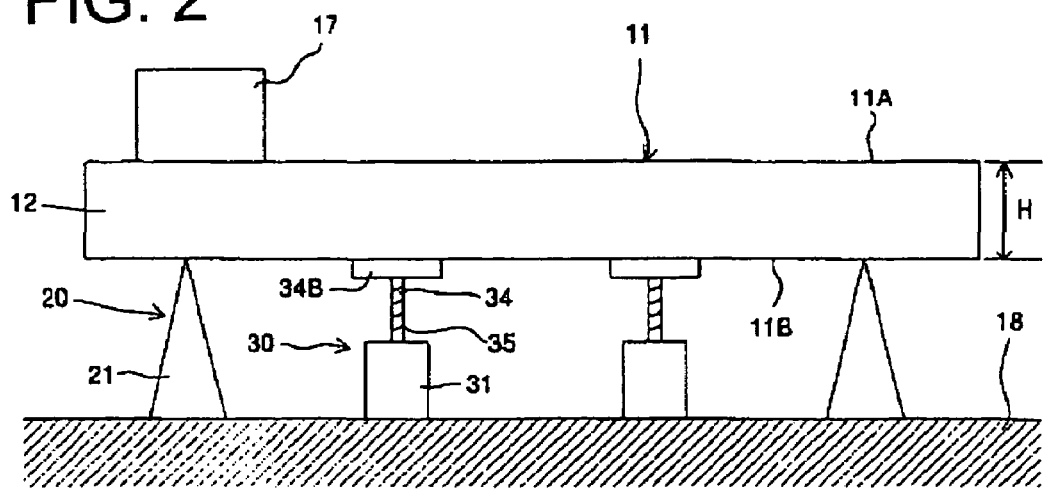
FIG. 2 is a side elevational view of the plain surface stage apparatus shown in FIG. 1.
Figure 3:
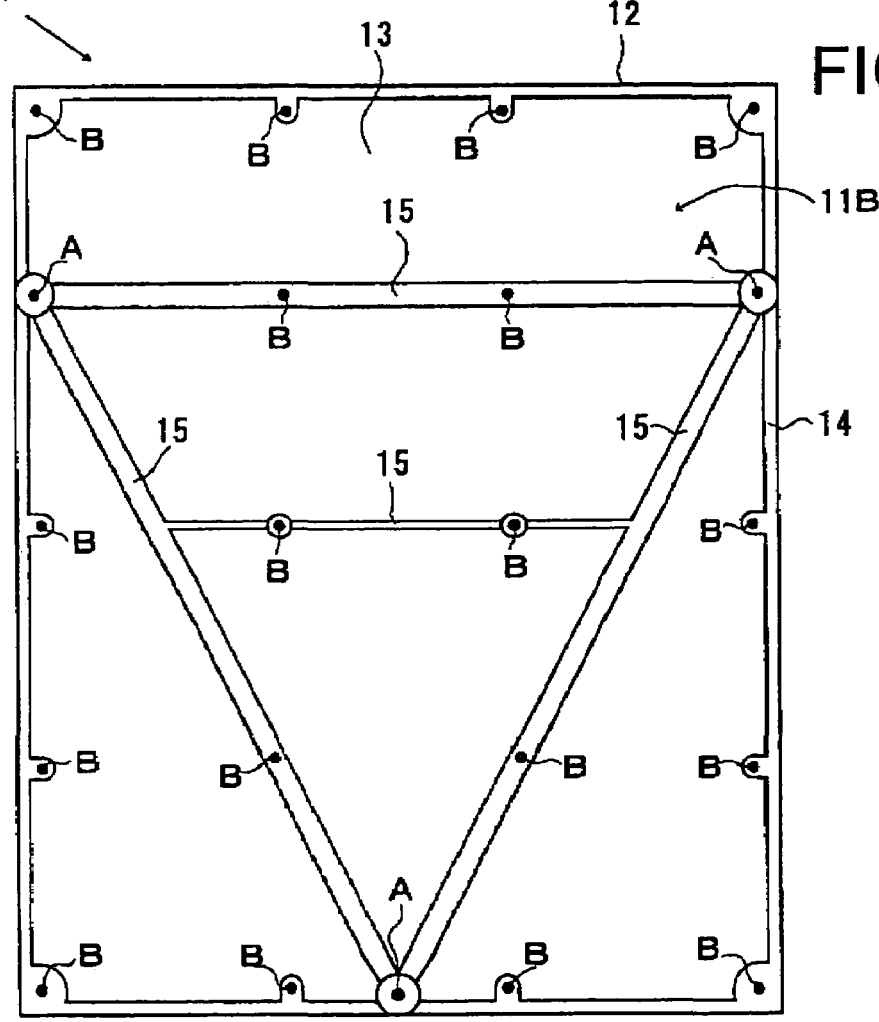
FIG. 3 is a bottom elevational view of a platen of the plain surface stage apparatus shown in FIG. 1.

FIG. 2 is a side elevational view of the plain surface stage apparatus shown in FIG. 1. FIG. 3 is a rear elevational view of a platen of the plain surface stage apparatus shown in FIG. 1.

The plain surface stage apparatus is suitably used as a work stage of a step and repeat exposure apparatus. The plain surface stage apparatus comprises the platen 1 having a plain surface 11A (hereinafter referred to as a particular plain surface) on which projecting poles (not shown) formed in, for example, a grid structure, are provided and a movable body 17 that moves on the particular plain surface 11A of the platen 11. The platen 11 is supported by stationary type supporting means 20 comprising three supporting members 21 and one or more displacement type supports 30 having a particular structure and forming supporting points other than the supporting points formed by the stationary type supporting means 20.

In this example shown in the figure, the plain surface stage apparatus is disposed on a base plate 18 which is provided on a vibration removing apparatus (not shown).

The platen 11 made of iron or metal has a platen body 12. On an outer surface of a ceiling board 13 of the platen body 12, the particular plain surface 11A is formed.

In the figures showing an example, a layer made of non-magnetic resin is formed in depressed portions, that is, gaps among projecting poles. (Refer to FIG. 9.)

A beam 15 is provided to increase the mechanical strength of the platen 11 in a space surrounded by a rib 14 vertically extending from the rim of the ceiling surface board 13 of the platen 12.

As to the particular plain surface 11A of the platen 11, the flatness of the top surface formed by the surface of the projecting poles is set to ±1 $\mu$m to ±10 $\mu$m in an unloaded stage of the platen 11.

The "unloaded state" means the following:
(1) a state where the movable body 17 is not on the particular plan surface 11A of the platen 11; or
(2) a state where the movable body 17 is placed at a point on the particular plain surface 11A of the platen 11, which is located right above any one of the supporting points formed by the stationary type supporting means 20.

The thickness H of the platen 11 is preferably 100 mm to 200 mm and the thickness of the ceiling plain surface 13 of the platen body 12 is preferably 10 to 20 mm.

In this example shown in the figure, the particular plain surface 11A of the platen 11 is but not limited to 1,500 mm by 1,200 mm in size. For example, if necessary, it is possible to select the size based on intended usage of the plain surface stage apparatus.

On the rear side surface 11B of the platen 11 (the inner surface of the ceiling plain board 13 of the platen body 12), as shown in FIG. 3, the three supporting points A formed by the stationary type supporting means 20 (herein after referred to as stationary type supporting points) and a plurality of supporting points B (18 points are shown as an example in FIG. 3) formed by displacement type supports 30 (hereinafter referred to as displacement type supporting points) are provided.

The center of the triangle formed by the three stationary type supporting points A is placed at the place where the gravity of the platen 11 of the plain surface stage apparatus is located.

In FIG. 3, the center of gravity of the platen 11 of the plain surface stage apparatus deviates from the center of the platen 11 due to the exposure apparatus and the other components, such as a projection lens, an optical frame 19 for holding a mask stage for supporting a mask for exposing a work piece.

The displacement type supporting points B are uniformly provided in the entire area including the rim portion of the rear side surface 11B of the platen 11 except the area where the stationary type supporting points A are formed.

The displacement type supporting points B is set to a position where, for example, it is possible to reduce the bending of the platen 11 caused by moving the movable body 17 on the particular plain surface of the platen 11 and to obtain the necessary stability of flatness, by taking the number of the displacement type supports 30 into consideration.

The stationary type supporting means 20 comprises the three support members 21, each of which forms a stationary type supporting point A (the total number thereof is 3). The height of the platen 11 from the base plate 18 and the horizontalness of the platen 11 to the base plate 18 are defined by the stationary supporting means 20.

Figure 4:
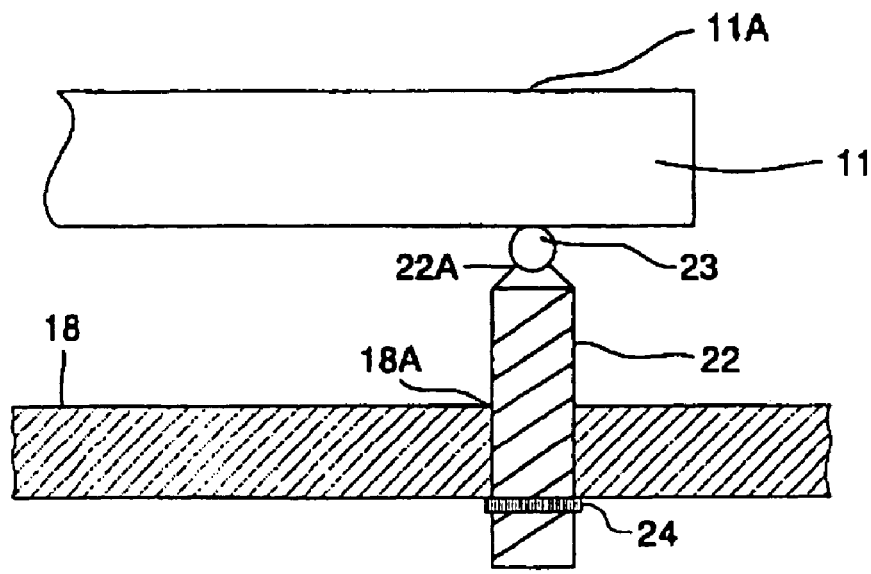
FIG. 4 shows a view of a supporting member used as a stationary type supporting means of the plain surface stage apparatus shown in FIG. 1.

In this embodiment, as the supporting member 21, as shown in FIG. 4, a ball top screw comprising a male screw 22 having a ball 23 at a tip 22A of the male screw 22 is used. The ball top screw has a height adjustment mechanism that adjusts penetration depth of the screw to a through hole for the supporting members formed on the base plate 18 and holds the screw at the penetration depth by a nut 24 so that it is possible to adjust the horizontalness and the height of the platen 11 to the base plate 18.

The ball top screw does not move in a direction perpendicular to the particular plain surface 11A of the platen 11 in a state where the height and the horizontalness of the platen 11 to the base plate 18 are retained.

The displacement type supports 30 are movable in a direction perpendicular to the particular plain surface 11A of the platen 11 (a vertical direction in FIG. 2) by expanding and contracting and holds the selected displacement position of the screw (hereinafter referred to as a specific displacement state).

Figure 5:
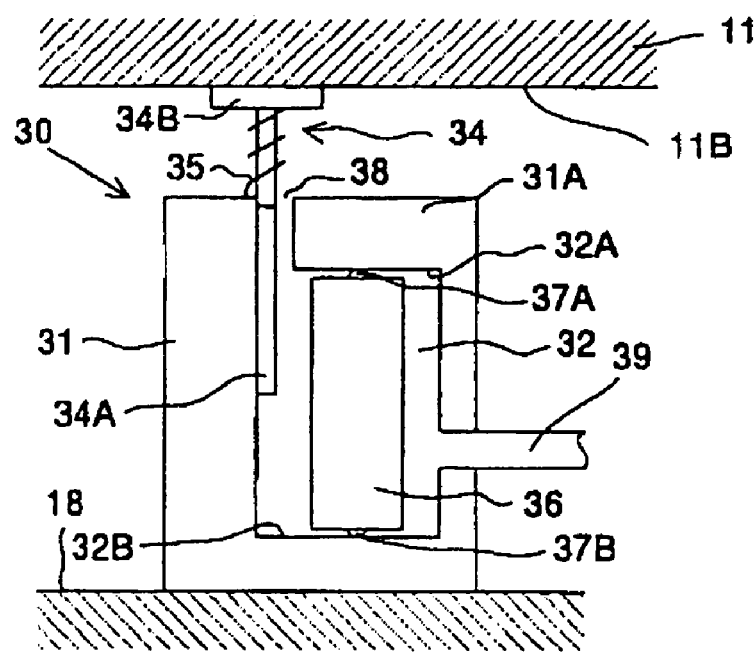
FIG. 5 shows a view of a displacement type support suitably used for the plain surface stage apparatus shown in FIG. 1.

The displacement type supports 30 having such a structure shown in FIG. 5 is suitable for use.

Each of the displacement type supports 30 have a block placement space 32. The cross sectional view of the space is rectangular. A supporting member body 31 has a guide hole 38 that penetrates the ceiling surface board 31A so as to connect to the block placement space 32. Each of the displacement type supports 30 has a supporting pole 34, at one end of which a disc 34A is connected thereto, and at the other end of which a supporting base 34B is formed. The disc 34A is inserted in the block placement space 32 via the guide hole 38 of the supporting member body 31. The surface of the supporting base 34B is in contact with the rear side surface 11B of the platen 11. The supporting pole 34 is connected to the supporting base 34B at the one end and the supporting member body 31 at the other end. The supporting pole 34 is held and supported to the supporting member body 31 by a compression spring 35 which is provided so as to wind around the outer surface of the supporting pole 34.

In the block placement space 32 of the supporting member body 31, a holding block 36 is provided in which rollers 37A and 37B is provided on a top portion of the holding block 36 and at a bottom portion of the holding block, respectively. The rollers 37A and 37B are in contact with the ceiling surface boards 32A and a bottom surface 32B of the block placement space 32 respectively. The holding block 36 is slidable in parallel to the particular plain surface 11A of the platen 11 in an advancing direction and a sliding back direction (left and right directions in FIG. 5) with respect to the disc 34A of the supporting pole 34. The one side of the holding block 36 faces the disc 34A.

The holding block 36 slides by air supplied via an air pipe 39 connecting an air supplying apparatus (not shown) to the block placement space 32 since there is an opening facing the disc 34A of the supporting pole 34.

The supporting member body 31 and the block placement space 36 of the displacement type supports 30 are made of stainless. The disc 34A of the supporting pole 34 needs to be made of, for example, material having a small stretch rate, such as stainless, phosphor bronze and the like.

Figure 6:
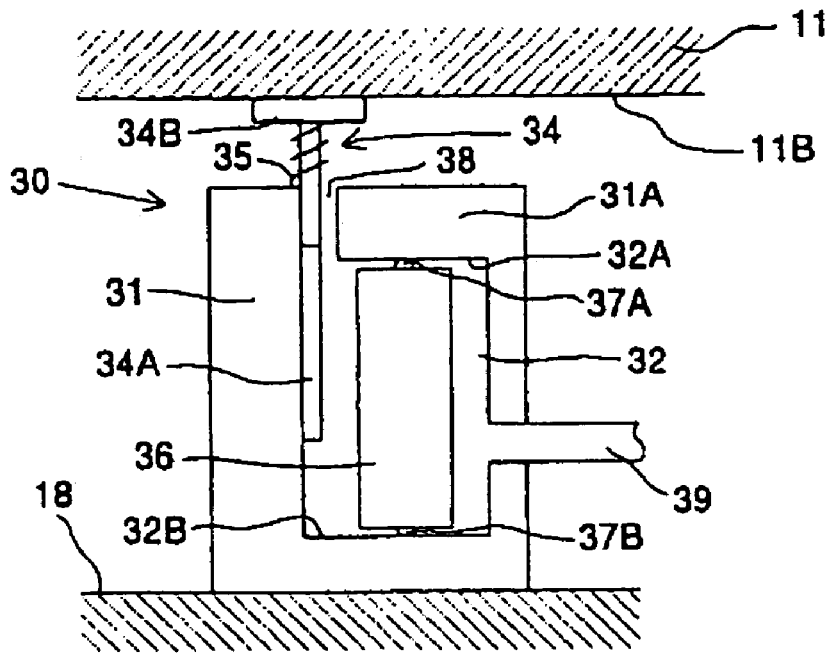
FIG. 6 is a view showing a certain displacement state of the displacement type support.
Figure 7:
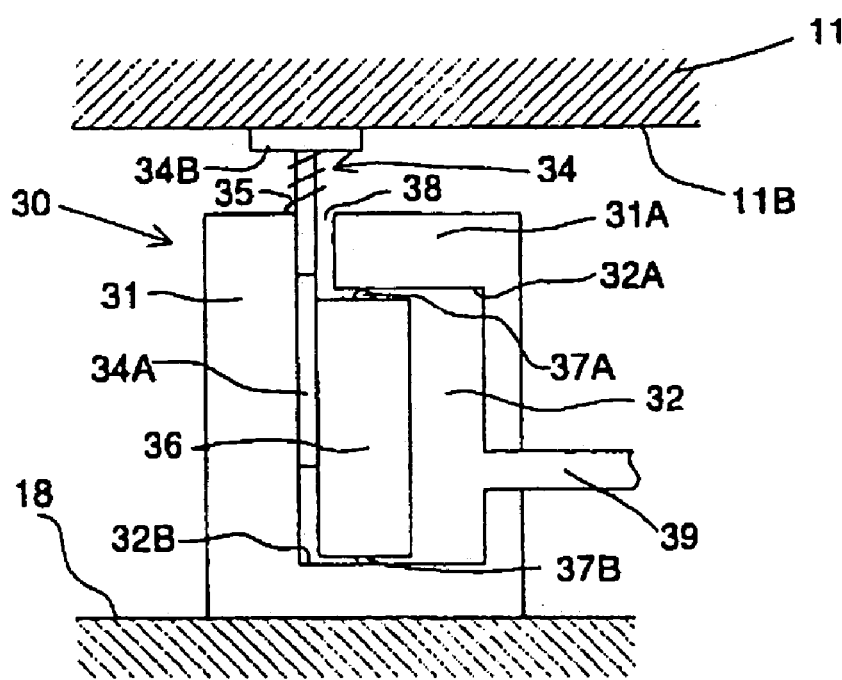
FIG. 7 is a view showing a certain displacement state where the displacement type support is displaced.
Figure 8:
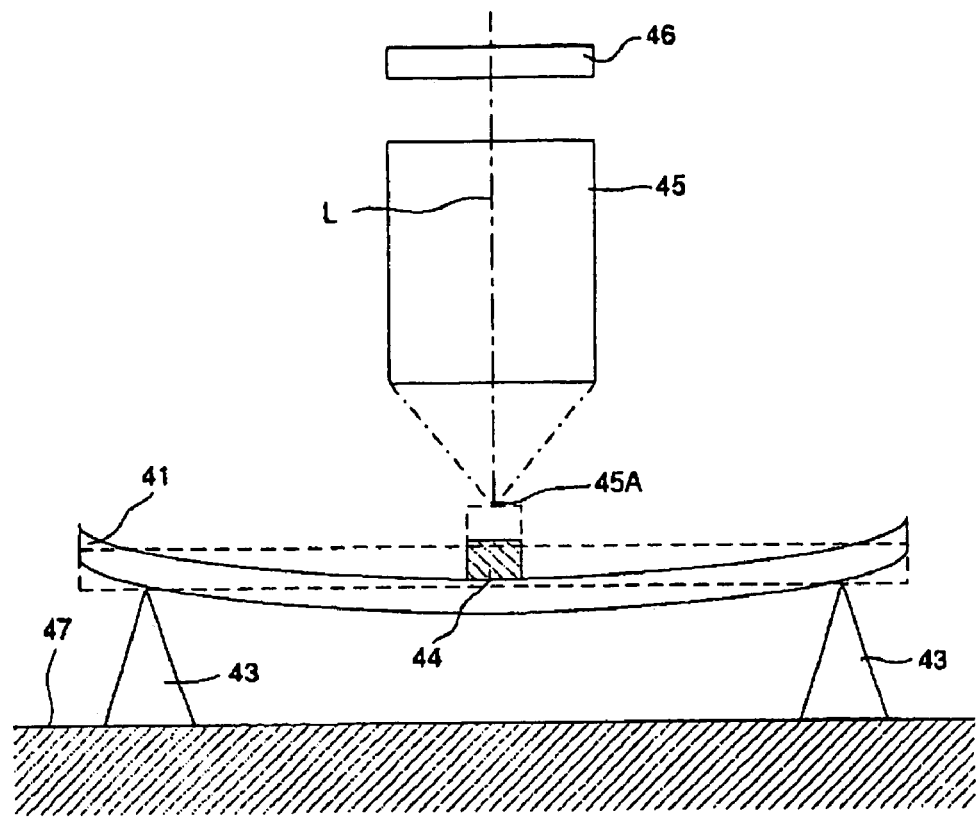
FIG. 8 shows an example of an exposure apparatus in which a conventional plain surface stage apparatus is used.

When, in the displacement type supports 30 having such a structure, as shown in FIG. 5, in a state where the holding block 36 is apart from the disc 34A of the supporting pole 34 (a movable state), a load is applied to the supporting base 34B from the top, as shown in FIG. 6, the supporting base 34B of the displacement type supports 30 moves downward (downward in FIG. 6) by deformation of the compression spring 35 so that the disc 34A moves deeply into the block placement space 32. When, as shown in FIG. 7, in a certain displacement state, air is supplied via the air pipe 39 from the air supplying apparatus into the block placement space 32, the holding block 36 slides toward the disc 34A in the advancing direction (in the left direction in FIG. 7) so that the disc 34A is held between the holding block 36 and the inner wall surface of the block placement space 32 thereby fixing the position of the supporting base 34B. The selected particular displacement state of the displacement type supports 30 is maintained.

The displacement type supports 30 preferably have a displacement state maintaining function whose variation in the displacement state due to the displacement by less than 245 N load (for example, variation of the supporting base 34B) is less than 1 $\mu$m.

To obtain such a displacement state maintaining function, for example, an air supply pressure by the air supplying apparatus is set to 490 kPa, the holding surface area of the disc 34A being set to the area equal to that of a 70 mm diameter circle and the holding pressure of the holding block 36 being set to 19.6 MPa.

In the plain surface stage apparatus having such a structure, even though the platen 11 is supported by the displacement type supporting means and the stationary type supports, the displacement state is maintained as if the displacement type supports 30 are supported by only the stationary type supporting means 20 so that the platen 11 is in a unloaded state.

In particular, although the particular plain surface of the platen 11 in the plain surface stage apparatus has a certain flatness of the particular plain surface, since the rear side surface 11B naturally bends due to its own weight, the displacement type supports 30 maintains, as a specific displacement state, the displacement state of the rear side surface 11B of the platen 11 due to the natural bending so as to form the displacement type supporting points B.

The displacement type supporting points B of the displacement type supports 30 are formed in a manner described below.

First, platen material having a plain surface to be used as a particular surface is prepared and then three supporting points are formed on the rear side surface of the platen material in an unloaded state. Then, the height and the horizontalness of the platen material to the base plate 18 are adjusted by the height adjustment mechanism of the stationary type supporting means 20 and the platen material is supported by the stationary type supporting means 20. At this point, the platen material is supported by only the stationary type supporting means 20 so that the platen material bends naturally due to its own weight. In the state where the platen material bends, only the surface of the platen material is processed for a plain surface by a grinding process so as to obtain a platen 11 having a particular plain surface 11 with a desired flatness.

Next, in a state where the a supporting base 34B is in contact with the rear side surface 11B of the platen 11 in the natural bending state, the displacement type supports 30 in the movable state, which are provided in a predetermined position, is made to hold the platen 11 in the displacement state due to the natural bending, thereby forming displacement type supporting points B whose number corresponds to the number of the displacement type supports 30.

The displacement type supports 30 may be disposed either before or after the plain surface process of the platen material is carried out.

The movable body 17 is connected to a movable body controlling unit 17A that supplies air to the movable body 17 via an arm portion 17B and impresses magnetic force to the movable body 17. Above the particular plain surface 11A of the platen 11, the magnetic force is impressed to the movable body 17 which is floating in the air, for example, a couple of micrometer to over ten $\mu$m above the particular plain surface by the air, and then the magnetic field between the movable body 17 and the projecting poles of the platen 11 is changed so as to move the movable body on the particular plain surface 11A.

In the example shown in the figure, an optical sensor(s) (not shown) is provided on each side of the movable body 17 so that it is possible to prevent the moving body from deviating from the particular plain surface 11A of the platen 11, by the operation of the optical sensors.

According to the plain surface apparatus having such a structure, since the height and the horizontalness of the platen 11 with respect to the base plate 18 are defined by the stationary type supporting means 20 and it is possible to form the displacement type supporting points B whose number corresponds to the number of the displacement type supports 30 without changing the state of the platen 11 (the height, horizontalness, and flatness) at points other than stationary type supporting points A by the displacement type supports 30, it is possible to certainly support the platen 11 at more than three points. For example, unlike a plain surface apparatus in which a base comprising a rock top plate or trussing body is used, there is no problem that the apparatus itself grows in size since the mass and outer dimension increase. In case that the movable body 17 moves outside the position right above the stationary type supporting points A, since it is possible to control the bending of the platen 11, it is possible to control variation of the flatness of the particular plain surface 11A of the platen 11 due to the bending.

For particular purpose, the maximum bending amount of the platen 11 is controlled to less than 3 $\mu$m when one meter diameter large size work piece is placed on a 50 Kg (the total weight) movable body.

Since the displacement type supports 30 expands and contracts perpendicularly to the particular plain surface 11A of the platen 11 and has a structure in which a selected displacement state can be maintained so that it is possible to select and hold a desirable displacement state based on a state of the platen 11, it is possible to certainly and easily form the displacement type supporting points B to the platen 11 supported at three stationary type supporting points A formed by the stationary type supporting means 20.

Therefore, according to the plain surface stage apparatus, it is possible to obtain excellent stability of flatness of the platen in a simple manner, and to miniaturize the apparatus itself.

Further, since the height of each of supporting member 21 comprising the stationary type supporting means 20 and each displacement type support 30 is individually adjustable, even though there is, for example, about 1 mm convexo-concave of the base plate, it is possible to obtain the desirable flatness and the excellent stability of flatness of the platen 11.

In a step and repeat exposure apparatus in which a plain surface stage apparatus is used as a work stage, a work piece having a plurality of divided surface portions to be exposed is placed on the movable body 17 and is moved on the particular plain surface 11A of the platen 11 so as to carry out, in order, an exposure process to each of the divided surface portions. In the present invention, even where the movable body 17 carrying the large size work piece moves to a position other than the positions right above the stationary type supporting points A of the stationary type supporting means 20, it is possible to prevent the platen 11 from bending. Accordingly, since the position with respect to the optical axis of the work piece on the movable body 17 does not change a lot, it is possible to carry out a high accuracy exposure process to the work piece, thereby, as a result, providing high reliability to an exposure process.

Further, in the step and repeat exposure apparatus, it is possible to simplify the structure of the work stage. Furthermore, in the plain surface stage apparatus, since it is not necessary to use a large size base to obtain high stability of flatness, it is possible to accomplish reduction of a work stage in size and weight.

Although an example of The description of the plain surface state apparatus according to the present invention is given above as the embodiments. However, the present invention is not limited to the embodiments described above, and it is possible to make various changes to the embodiments. For example, the plain surface stage apparatus is not limited to the structure having a movable body. The platen having a plain surface may be merely supported by stationary type supporting means and displacement type supports. The plain surface stage apparatus having such a structure can be suitably used for, for example, a reference plane of various measuring apparatuses.

Although preferably, the plain surface stage apparatus has such a structure that there are plurality of displacement type supports to obtain the high stability of flatness of the platen, it may have only one displacement type support. In such a case, it is possible to obtain higher stability of flatness than that of a plain surface stage apparatus supported by only stationary type supporting means.

In such a plain surface stage apparatus can be suitably used for, for example, a measuring reference plane or an optical measurement surface table of a measuring apparatus in addition to the work stage of the step and repeat exposure apparatus.

Description of experiments to confirm the operation and advantages of the present invention will be given below.

Experiment 1

In the plain surface stage apparatus in this experiment, a platen shown in FIG. 1 (dimension: 1,800 mm by 1,000 mm and 150 mm thickness) having the platen body (the thickness of the ceiling surface board of the platen body: 20 mm) which was supported by stationary type supporting means comprising three supporting members having the structure shown in FIG. 4 and displacement type supports having the structure shown in FIG. 5 was used.

The platen had a 600 mm by 600 mm particular plain surface and the movable body had a 50 Kg weight that moved on the platen (hereinafter referred to it as a plain surface stage apparatus (1)).

The plain surface stage apparatus (1) was prepared by preparing platen material having a plain surface as a particular plain surface, forming three supporting points on the rear side surface of the unloaded platen material by stationary type supporting means, thereby supporting and adjusting the height and the horizontalness of the platen material with respect to the base plate by a height adjustment mechanism of the stationary type supporting means, carrying out a plain surface process by grinding only the surface of the platen material in a state where the platen material was supported by only the stationary type supporting means and naturally bended by its own support, obtaining a platen having a particular plain surface having flatness in the range of ±10 µm, placing, in predetermined positions as shown in FIG. 3, eighteen displacement type supports whose supporting bases were in contact with the rear side surface of the platen in the state where the bending occurred naturally, and maintaining displacement state due to the natural bending of (the rear side surface of) the platen and forming eighteen displacement type supporting points by the displacement type supports.

The bending amount of the platen was 3 µm where a 1 meter diameter work piece was placed on a movable body of the plain surface stage apparatus (1) and the 50 Kg (the total weight) movable body on which the work piece was placed was moved on the particular plain surface.

Comparative Experiment 1

In the Comparative Experiment 1, the same plain surface apparatus (hereinafter referred to as a comparative experiment plain surface stage apparatus (1)) as that in the Experiment 1 was prepared except that the displacement type supports were not used. The maximum bending amount of the platen in the comparative experiment (1) was measured in the same manner as that of the Experiment 1 except that the Comparative Experiment plain surface stage apparatus (1) was used. The maximum bending amount was 20 µm.

In view of the results described above, it is proved that the plain surface stage apparatus (1) according to the Experiment (1) has more excellent stability of the flatness than that of the Comparative Experiment (1).

Figure 9:
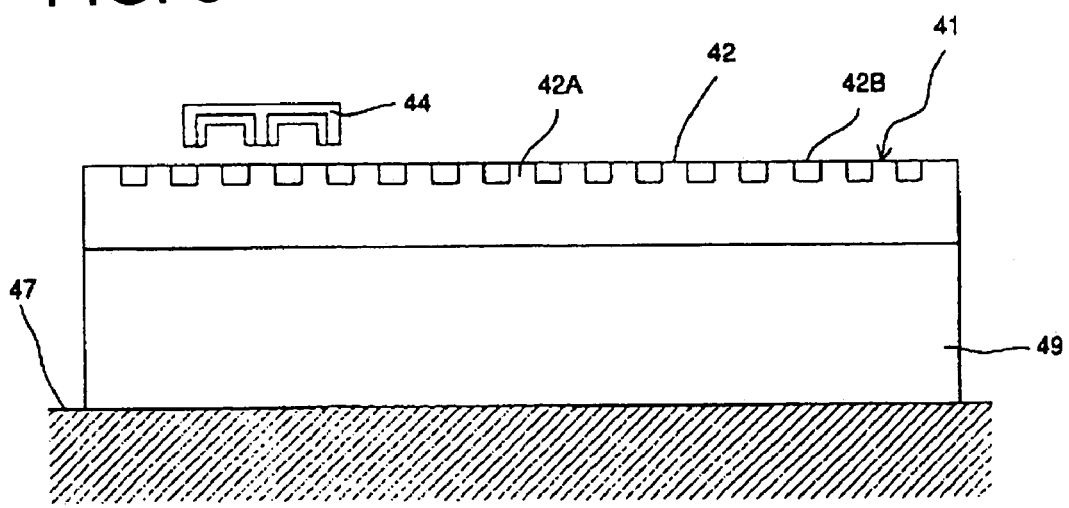
FIG. 9 shows an example of the conventional plain surface stage apparatus.

Further, the same plain surface stage apparatus as the plain surface stage apparatus (1) was prepared except that the stationary type supporting means and displacement type supports were not used and the platen was integrally provided on a base made of a rock top plate as shown in FIG. 9. The stability of the flatness of the plain surface stage apparatus was almost the same as that of the plain surface stage apparatus (1). In the case, especially, the weight of the rock top plate was extremely heavy and the plain surface stage apparatus grew in size, and further, it was difficult to process, with high precision, the base to obtain the flatness thereof which is required to obtain the desired stability of the flatness.

According to the present invention, since, on the platen in a state where the height and the horizontalness with respect to the surface on which the plain surface stage apparatus is provided, are defined by the stationary type supports, the supporting points whose number corresponds to the number of the displacement type supporting means, are formed by the displacement type supporting means at positions other than the supporting points formed by the stationary type supports, it is possible to certainly support the platen by more than three points thereby preventing the apparatus itself from growing in size and controlling changes of flatness of the platen plain surface due to the bending of the platen by load onto the platen.

Further, since the displacement type supports expands and contracts in a direction perpendicular to the plane surface of the platen and has structure to hold a selected displacement state, and since it is possible to hold the displacement stage according to a state of the platen, it is possible to certainly and easily form new supporting points to the platen in the state where supporting points are formed by the stationary type supporting means.

Therefore, according to the present invention, in the plain surface stage apparatus, it is possible to obtain the excellent stability of flatness of the platen in a simple manner, and it is possible to miniaturize the apparatus itself.

Further, in the plain surface stage apparatus according to the present invention, even though the movable body moves on the plain surface of the platen, the occurrence of bending of the platen due to the movement of the movable body is controlled thereby obtaining the excellent stability of flatness.

The disclosure of Japanese Patent Application No. 2002-304299 filed on Oct. 18, 2002 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A plain surface stage apparatus comprising:
    a platen having a plain surface;
    stationary type supports comprising at least three supporting members, wherein the stationary type supports support the platen at respective three supporting points; and
    displacement type supports, each of which supports the platen and forms a displacement type supporting point at a position other than positions of these three supporting points formed by the stationary type supports, wherein the displacement type supports expand and contract in a direction perpendicular to the plain surface of the platen so as to be displaced, and hold a selected displaced state of the displacement type supports.

2. The plain surface stage apparatus according to claim 1, wherein the displacement type supports hold the platen in the same displacement state as that in which the platen is supported by only the stationary type supports without load.

3. The plain surface stage apparatus according to claim 1, further including a movable body which is movable on the plain surface of the platen.

4. A method for making a plain surface stage apparatus, the method comprising the following steps of:
    preparing platen material having a plain surface as a particular plain surface;
    forming at least three supporting points on a rear side surface of the platen material by stationary type supports;
    adjusting height and horizontalness of the platen material with respect to a base plate;
    carrying out a plain surface process to the surface of the platen material which is in a state where the platen material is supported by only the stationary type supports and naturally bended by its own weight, placing, in predetermined positions, a plurality of displacement type supports whose supporting bases are in contact with the rear side surface of the platen in the state where natural bending occurs; and forming displacement type supporting points by the displacement type supports.

* * * * *